United States Patent [19]
Zhou et al.

[11] Patent Number: 6,017,826
[45] Date of Patent: Jan. 25, 2000

[54] CHLORINE CONTAINING PLASMA ETCH METHOD WITH ENHANCED SIDEWALL PASSIVATION AND ATTENUATED MICROLOADING EFFECT

[75] Inventors: Mei-Sheng Zhou; Paul Kwok Keung Ho, both of Singapore, Singapore; Thomas Schuelke, Ann Arbor, Mich.

[73] Assignee: Chartered Semiconductor Manufacturing, Ltd., Singapore, Singapore

[21] Appl. No.: 09/166,746

[22] Filed: Oct. 5, 1998

[51] Int. Cl.[7] ................................................ H01L 21/00
[52] U.S. Cl. .......................... 438/720; 216/67; 216/77; 438/742; 438/734; 438/738
[58] Field of Search .................. 216/67, 47, 77, 216/79; 438/719, 720, 734, 736, 742, 740, 738

[56] References Cited

U.S. PATENT DOCUMENTS

| | | | |
|---|---|---|---|
| 5,211,804 | 5/1993 | Kobayashi | 156/665 |
| 5,369,053 | 11/1994 | Fang | 438/720 X |
| 5,540,812 | 7/1996 | Kadomura | 156/652.1 |
| 5,578,163 | 11/1996 | Yachi | 156/643.1 |
| 5,582,679 | 12/1996 | Lianjun et al. | 156/651.1 |
| 5,614,060 | 3/1997 | Hanawa | 156/643.1 |
| 5,660,681 | 8/1997 | Fukuda et al. | 438/695 |
| 5,700,740 | 12/1997 | Chen et al. | 438/710 |

*Primary Examiner*—William Powell
*Attorney, Agent, or Firm*—George O. Saile; Rosemary L.S. Pike; Alek P. Szecsy

[57] ABSTRACT

A method for forming a patterned layer within a microelectronics fabrication. There is first provided a substrate. There is then formed over the substrate a blanket chlorine containing plasma etchable layer. There is then formed upon the blanket chlorine containing plasma etchable layer a blanket hard mask layer. There is then formed upon the blanket hard mask layer a patterned photoresist layer. There is then etched the blanket hard mask layer to form a patterned hard mask layer while employing a first plasma etch method in conjunction with the patterned photoresist layer as a first etch mask layer. There is then etched the blanket chlorine containing plasma etchable layer to form a patterned chlorine containing plasma etchable layer while employing a second plasma etch method in conjunction with at least the patterned hard mask layer as a second etch mask layer. The second plasma etch method employs a second etchant gas composition which upon plasma activation forms a chlorine containing etchant species and a sidewall passivation layer forming species. The patterned chlorine containing plasma etchable layer has incident to the second plasma etch method a sidewall passivation layer formed upon a sidewall of the patterned chlorine containing plasma etchable layer. Finally, there is then stripped from the sidewall of the patterned chlorine containing plasma etchable layer the sidewall passivation layer while sequentially oxidizing the sidewall of the patterned chlorine containing plasma etchable layer to form an oxidized chlorine containing plasma etchable material sidewall layer upon a partially oxidized patterned chlorine containing plasma etchable layer while employing a third plasma etch method. The third plasma etch method employs a third etchant gas composition which upon plasma activation forms an oxygen containing oxidizing species.

13 Claims, 5 Drawing Sheets

CHLORINE CONTAINING PLASMA ETCH METHOD WITH ENHANCED SIDEWALL PASSIVATION AND ATTENUATED MICROLOADING EFFECT

BACKGROUND OF THE INVENTION

1. Field of the Invention

The present invention relates generally to chlorine containing plasma etch methods for forming patterned layers within microelectronics fabrications. More particularly, the present invention relates to chlorine containing plasma etch methods for forming with enhanced sidewall passivation and attenuated microloading effect patterned layers within microelectronics fabrications.

2. Description of the Related Art

Microelectronics fabrications are formed from microelectronics substrates over which are formed patterned microelectronics conductor layers which are separated by microelectronics dielectric layers.

As microelectronics fabrication integration levels have increased and microelectronics fabrication device and patterned microelectronics conductor layer dimensions have decreased, it has become increasingly more important to fabricate within microelectronics fabrications narrow linewidth patterned microelectronics conductor layers, such as patterned aluminum containing conductor layers, with increased aspect ratios. Within advanced microelectronics fabrications, narrow linewidth patterned microelectronics conductor layers typically desirably have a minimum linewidth of less than about 1.0 microns, more preferably from about 0.2 to about 0.5 microns, while such patterned microelectronics conductor layers typically simultaneously possess an aspect ratio of greater than about 1, more preferably from about 2 to about 3.

While narrow linewidth and high aspect ratio patterned aluminum containing conductor layers are thus desirable within the art of microelectronics fabrication, narrow linewidth and high aspect ratio patterned aluminum containing conductor layers are not formed entirely without problems within microelectronics fabrications. Of the problems encountered when forming within advanced microelectronics fabrications narrow linewidth patterned aluminum containing conductor layers while employing conventional chlorine containing plasma etch methods, particularly notable problems include: (1) limited thicknesses of patterned photoresist layers which may be employed when forming narrow linewidth patterned aluminum containing conductor layers, due to depth of focus limitations of photoexposure tools employed when forming those patterned photoresist layers; (2) patterned aluminum containing conductor layer sidewall inhomogeneity problems, such as undercutting or tapering; and (3) density related etching inhomogeneities, such as aspect ratio dependent etching effects and microloading effects.

It is thus desirable within the art of microelectronics fabrication to form within microelectronics fabrications narrow linewidth and high aspect ratio patterned aluminum containing conductor layers while employing chlorine containing plasma etch methods employing patterned photoresist layers of attenuated thickness to provide patterned aluminum containing conductor layers with uniform sidewall profiles while forming the patterned aluminum containing conductor layers with attenuated density related etching inhomogeneities such as aspect ratio dependent etching effects and microloading effects, that the present invention is generally directed. In a more general sense, the present invention is also directed towards forming within microelectronics fabrications while employing chlorine containing plasma etch methods employing patterned photoresist layers of attenuated thickness patterned chlorine containing plasma etchable layers, which need not necessarily be patterned aluminum containing conductor layers, with uniform sidewall profiles and attenuated density related etching inhomogeneities such as aspect ratio dependent etching effects and microloading effects.

Various methods have been disclosed within the art of microelectronics fabrication for forming patterned conductor layers, such as patterned aluminum containing conductor layers, with desirable properties within microelectronics fabrications.

For example, Kobayashi, in U.S. Pat. No. 5,211,804, discloses a plasma etch method for forming within a semiconductor integrated circuit microelectronics fabrication a patterned aluminum containing conductor layer with uniform sidewall profile of the patterned aluminum containing conductor layer and attenuated residue formation upon the patterned aluminum containing conductor layer. The plasma etch method employs a hard mask layer in conjunction with an etchant gas composition consisting essentially of a chlorine containing etchant gas, an oxygen containing etchant gas and a nitrogen containing etchant gas.

In addition, Kadomura, in U.S. Pat. No. 5,540,812, discloses a method for forming within an integrated circuit microelectronics fabrication a patterned aluminum containing conductor layer with attenuated corrosion of the patterned aluminum containing conductor layer, while forming the patterned aluminum containing conductor layer with attenuated consumption of a silicon oxide hard mask employed in forming the patterned aluminum containing conductor layer. In order to attenuate corrosion of the patterned aluminum containing conductor layer, there is employed a sulfur containing sidewall passivation layer upon the patterned aluminum containing conductor layer. In order to attenuate consumption of the silicon oxide hard mask layer, the silicon oxide hard mask layer is irradiated with a neutral beam, such as an argon beam.

Further, Yachi, in U.S. Pat. No. 5,578,163, discloses a method for forming within an integrated circuit microelectronics fabrication a patterned aluminum containing conductor layer without hardening a sidewall passivation polymer layer formed upon a sidewall of the patterned aluminum containing conductor layer. The method employs: (1) an activated hydrogen containing plasma at a temperature of less than about 150 degrees centigrade for removing from the sidewall passivation polymer layer chlorine residues; followed by (2) an oxygen containing plasma at a temperature of less than about 150 degrees centigrade for removing from the patterned aluminum containing conductor layer a patterned photoresist layer employed in defining the patterned aluminum containing conductor layer prior to removing the sidewall polymer passivation layer employing a wet chemical stripper solution.

Yet further, Lianjun et al., in U.S. Pat. No. 5,582,679, discloses a plasma etch method for forming a patterned aluminum containing conductor layer with attenuated undercutting or tapering within an integrated circuit microelectronics fabrication. Within the plasma etch method there is employed in conjunction with a chlorine containing etchant gas a nitrogen gas which provides a sidewall passivation layer upon the patterned aluminum containing conductor layer, thus attenuating undercutting or tapering of the patterned aluminum containing conductor layer.

Still further, Hanawa, in U.S. Pat. No. 5,614,060, discloses a plasma etch method for forming within an integrated circuit microelectronics fabrication a patterned metal layer with attenuated metal etch residues while simultaneously forming the patterned metal layer with attentuated erosion of a paterned photoresist layer employed in defining the patterned metal layer. Within the plasma etch method, the frequency and amplitude of a bias power are modulated to simultaneously provide for forming the patterned metal layer with attenuated metal etch residues while simultaneously forming the patterned metal layer with attenuated erosion of a patterned photoresist layer employed in defining the patterned metal layer.

Still yet further, Fukuda et al., in U.S. Pat. No. 5,660,681, discloses a method for forming within an integrated circuit microelectronics fabrication a patterned silicon containing material layer with attenuated particulate contamination and thus improved reliability and yield. The plasma etch method employs a first plasma comprising a chlorine or bromine containing etchant gas composition additionally comprising an oxygen containing species when forming the patterned silicon containing material layer from a corresponding blanket silicon containing material layer, where the first plasma is followed by a second plasma employing an oxygen containing etchant gas composition which oxidizes a sidewall of the patterned silicon containing material layer to form a silicon oxide sidewall coating. The silicon oxide sidewall coating may then be removed employing a hydrofluoric acid etchant.

Finally, Chen et al., in U.S. Pat. No. 5,700,740, discloses a method for forming within an integrated circuit microelectronics fabrication a patterned aluminum containing conductor layer with attenuated after corrosuion of the patterned aluminum containing conductor layer. The method employs an ammonium hydroxide rinsing of the patterned aluminum containing conductor layer to remove chlorine containing residues which contribute to after corrosion of the patterned aluminum containing conductor layer.

Desirable in the art of microelectronics fabrication are additional methods for forming within microelectronics fabrications patterned aluminum containing conductor layers while employing patterned photoresist layers of attenuated thicknesses to form the patterned aluminum containing conductor layers with uniform sidewall profile with attenuated density related etching inhomogeneities such as aspect ratio dependent etching effects and microloading effects. More generally desirable in the art of microelectronics fabrication are additional methods for forming within microelectronics fabrications patterned chlorine containing plasma etchable layers, which need not necessarily be patterned aluminum containing conductor layers, while employing patterned photoresist layers of attenuated thicknesses to form the patterned chlorine containing plasma etchable layers with uniform sidewall profile with attenuated density related etching inhomogeneities such as aspect ratio dependent etching effects and microloading effects.

It is towards the foregoing goals that the present invention is both specifically and more generally directed.

SUMMARY OF THE INVENTION

A first object of the present invention is to provide a method for forming within a microelectronics fabrication a patterned chlorine containing plasma etchable layer.

A second object of the present invention is to provide a method in accord with the first object of the present invention, where the patterned chlorine containing plasma etchable layer is formed employing an attenuated thickness of a patterned photoresist layer employed when forming the patterned chlorine containing plasma etchable layer to form the patterned chlorine containing plasma etchable layer with uniform sidewall profile while forming the patterned chlorine containing plasma etchable layer with attenuated density related etching inhomogeneities such as aspect ratio dependent etching effects and microloading effects.

A third object of the present invention is to provide a method in accord either the first object of the present invention or the second object of the present invention, where the chlorine containing plasma etchable layer is an aluminum containing conductor layer.

A fourth object of the present invention is to provide a method in accord with the first object of the present invention, the second object of the present invention or the third object of the present invention, which method is readily commercially implemented.

In accord with the objects of the present invention, there is provided a method for forming a patterned layer within a microelectronics fabrication. To practice the method of the present invention, there is first provided a substrate. There is then formed over the substrate a blanket chlorine containing plasma etchable layer. There is then formed upon the blanket chlorine containing plasma etchable layer a blanket hard mask layer. There is then formed upon the blanket hard mask layer a patterned photoresist layer. There is then etched the blanket hard mask layer to form a patterned hard mask layer while employing a first plasma etch method in conjunction with the patterned photoresist layer as a first etch mask layer. The first plasma etch method employs a first etchant gas composition appropriate to a hard mask material from which is formed the hard mask layer. There is then etched the blanket chlorine containing plasma etchable layer to form a patterned chlorine containing plasma etchable layer while employing a second plasma etch method in conjunction with at least the patterned hard mask layer as a second etch mask layer. The second plasma etch method employs a second etchant gas composition which upon plasma activation forms a chlorine containing etchant species and a sidewall passivation layer forming species. The patterned chlorine containing plasma etchable layer has incident to the second plasma etch method a sidewall passivation layer formed upon a sidewall of the patterned chlorine containing plasma etchable layer. Finally, there is then stripped from the sidewall of the patterned chlorine containing plasma etchable layer the sidewall passivation layer while sequentially oxidizing the sidewall of the patterned chlorine containing plasma etchable layer to form an oxidized chlorine containing plasma etchable material sidewall layer upon a partially oxidized patterned chlorine containing plasma etchable layer while employing a third plasma etch method. The third plasma etch method employs a third etchant gas composition which upon plasma activation forms an oxygen containing oxidizing species.

The present invention provides a method for forming a patterned chlorine containing plasma etchable layer within a microelectronics fabrication, where the patterned chlorine containing plasma etchable layer is formed employing an attenuated thickness of a patterned photoresist layer employed when forming the patterned chlorine containing plasma etchable layer to form the patterned chlorine containing plasma etchable layer with uniform sidewall profile while forming the patterned chlorine containing plasma etchable layer with attenuated density related etching inhomogeneities such as aspect ratio dependent etching effects and microloading effects. The method of the present invention realizes the foregoing objects by employing when forming the patterned chlorine containing plasma etchable layer from a corresponding blanket chlorine containing plasma etchable layer: (1) a patterned hard mask layer in conjunction with; (2) a sequential pair of plasma etch methods, where a first of the sequential pair of plasma etch methods employs an etchant gas composition which upon plasma activation forms a chlorine containing etching species and a sidewall passivation layer forming species. The sidewall passivation layer forming species forms a sidewall passivation layer upon a sidewall of the patterned chlorine containing plasma etchable layer, where the sidewall passivation layer is subsequently stripped from the patterned chlorine containing plasma etchable layer within the second of the sequential pair of plasma etch methods while subsequently sequentially oxidizing the patterned chlorine containing plasma etchable layer to form a partially oxidized chlorine containing plasma etchable layer having an oxidized chlorine containing plasma etchable material sidewall passivation layer formed thereupon.

The method of the present invention may be employed where the blanket chlorine containing plasma etchable layer is a blanket aluminum containing conductor layer. The present invention does not discriminate with respect to the nature of a blanket chlorine containing plasma etchable layer from which may be formed a patterned chlorine containing plasma etchable layer employing the method of the present invention, provided that the chlorine containing plasma etchable layer is formed of a chlorine containing plasma etchable material which is simultaneously oxidizable within a plasma employing an etchant gas composition which upon plasma activation forms oxygen containing oxidizing species. Thus, the present invention may be employed where the chlorine containing plasma etchable layer is formed from an aluminum containing conductor material, as well as several other chlorine containing plasma etchable materials including but not limited to other chlorine containing plasma etchable metals and metal alloys, as well as silicon materials, such as but not limited to amorphous silicon materials, monocrystalline silicon materials and polycrystalline silicon materials.

The present invention is readily commercially implemented. The present invention employs methods and materials as are otherwise generally known in the art of microelectronics fabrication. Since it is the process control within the method of the present invention which provides at least in part novelty to the method of the present invention, rather than the existence of the methods and materials which provides the method of the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming a patterned chlorine containing plasma etchable layer within a microelectronics fabrication, where the patterned chlorine containing plasma etchable layer is formed: (1) while employing an attenuated thickness of a patterned photoresist layer employed in forming the patterned chlorine containing plasma etchable layer; and (2) with a uniform sidewall profile of the patterned chlorine containing plasma etchable layer while forming the patterned chlorine containing plasma etchable layer with attenuated density related etching inhomogeneities, such as aspect ratio density etching effects and microloading effects.

The method of the present invention realizes the foregoing objects by employing when forming the patterned chlorine containing plasma etchable layer from a corresponding blanket chlorine containing plasma etchable layer a patterned hard mask layer in conjunction with a sequence of two plasma etch methods. The first plasma etch method within the sequence of two plasma etch methods employs a etchant gas composition which upon plasma activation forms a chlorine containing etchant species and a sidewall passivation layer forming species which forms a sidewall passivation layer upon a sidewall of a patterned chlorine containing plasma etchable layer formed employing the first plasma etch method. Within the second plasma etch method, there is employed a second etchant gas composition which upon plasma activation forms an oxygen containing oxidizing species which sequentially strips from the patterned chlorine containing plasma etchable layer the sidewall passivation layer and then oxidizes the patterned chlorine containing plasma etchable layer to form a partially oxidized patterned chlorine containing plasma etchable layer having an oxidized chlorine containing plasma etchable material sidewall passivation layer formed thereupon.

The method of the present invention may be employed in forming patterned chlorine containing plasma etchable patterned layers of chlorine containing plasma etchable materials including but not limited to aluminum containing conductor materials, other chlorine containing plasma etchable conductor materials and silicon materials, such as but not limited to amorphous silicon materials, monocrystalline silicon materials and polycrystalline silicon materials, within microelectronics fabrications including but not limited to semiconductor integrated circuit microelectronics fabrications, solar cell microelectronics fabrications, ceramic substrate microelectronics fabrications and flat panel display microelectronics fabrications.

First Preferred Embodiment

Figure 1:
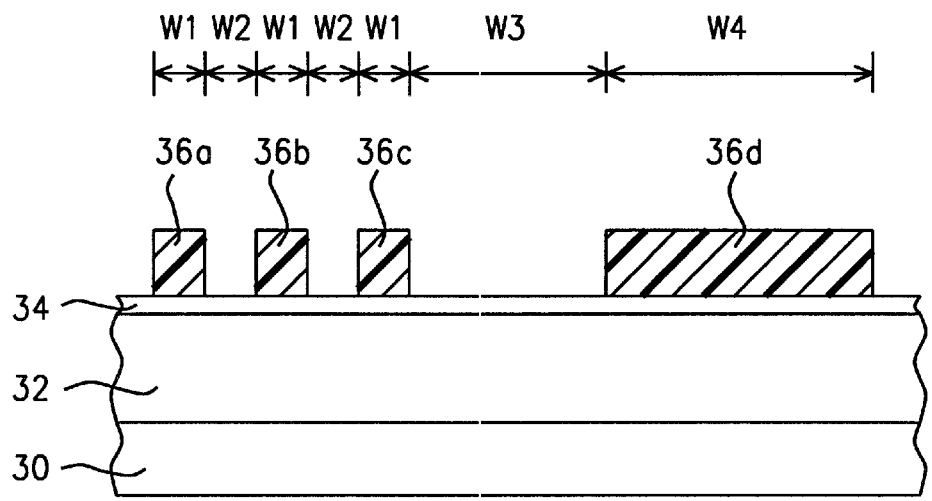
FIG. 1, FIG. 2, FIG. 3 and FIG. 4 show a series of schematic cross-sectional diagrams illustrating the results of forming in accord with a general embodiment of the present invention which comprises a first preferred embodiment of the present invention a patterned chlorine containing plasma etchable layer within a microelectronics fabrication.

Referring now to FIG. 1 to FIG. 4, there is shown a series of schematic cross-sectional diagram illustrating the results of progressive stages in forming within a microelectronics fabrication in accord with a general preferred embodiment of the present invention which comprises a first preferred embodiment of the present invention a patterned chlorine containing plasma etchable layer. Shown in FIG. 1 is a schematic cross-sectional diagram of the microelectronics fabrication at an early stage in its fabrication.

Shown in FIG. 1 is a substrate 30 having formed thereupon and thereover a pair of blanket layers. The pair of blanket layers includes: (1) a blanket chlorine containing plasma etchable layer 32 formed upon the substrate 30; and (2) a blanket hard mask layer 34 formed upon the blanket chlorine containing plasma etchable layer 32. Finally, there is shown within FIG. 1 a series of patterned photoresist layers 36a, 36b, 36c and 36d formed upon the blanket hard mask layer 34.

Within the first preferred embodiment of the present invention with respect to the substrate, the substrate 30 is a substrate employed within a microelectronics fabrication selected from the group of microelectronics fabrications including but not limited to semiconductor integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 30 may be a substrate alone employed within the microelectronics fabrication, or in the alternative, the substrate 30 may also be the substrate employed within a microelectronics fabrication, where the substrate has any of several additional microelectronics layers formed thereupon or thereover as are conventionally employed within the microelectronics fabrication within which is employed the substrate. Such additional microelectronics layers may include, but are not limited microelectronics conductor layers, microelectronics semiconductor layers and microelectronics dielectric layers.

Within the preferred embodiment of the present invention with respect to the blanket chlorine containing plasma etchable layer 32, the blanket chlorine containing plasma etchable layer 32 may be formed from any of several chlorine containing plasma etchable materials as are conventional in the art of microelectronics fabrication, provided that the chlorine containing plasma etchable material is also susceptible to oxidation within a plasma etch method employing an etchant gas composition which upon plasma activation forms an active oxygen containing oxidizing species. Such chlorine containing plasma etchable materials include but are not limited to aluminum, aluminum copper alloys, aluminum copper silicon alloys, other chlorine containing plasma etchable metals and metal alloys, as well as silicon materials, such as but not limited to amorphous silicon materials, monocrystalline silicon materials and polycrystalline silicon materials.

The blanket chlorine containing plasma etchable layer 32 may be formed employing methods as are conventional in the art of microelectronics fabrication, including but not limited to thermally assisted evaporation methods, chemical vapor deposition (CVD) methods and physical vapor deposition (PVD) sputtering methods. For the preferred embodiment of the present invention, the blanket chlorine containing plasma etchable layer 32 is preferably formed upon the substrate 30 to a thickness of from about 1000 to about 11000 angstroms.

Within the preferred embodiment of the present invention with respect to the blanket hard mask layer 34, the blanket hard mask layer 34 is formed of a hard mask material which exhibits limited susceptibility to etching within a plasma etch method employed for forming a series of patterned chlorine containing plasma etchable layers from the blanket chlorine containing plasma etchable layer 32. Such hard mask materials include, but are not limited to, certain other types of metals and metal alloys which are not etchable within chlorine containing plasma etch methods, as well as several dielectric materials, including but not limited to silicon oxide dielectric materials, silicon nitride dielectric materials and silicon oxynitride dielectric materials. For the preferred embodiment of the present invention, the blanket hard mask layer 34 is preferably formed upon the blanket aluminum containing conductor layer 32 from a dielectric hard mask material, such as but not limited to a silicon oxide dielectric hard mask material, a silicon nitride dielectric hard mask material or a silicon oxynitride dielectric hard mask material. Preferably, the blanket hard mask layer 34 is formed upon the blanket chlorine containing plasma etchable layer 32 to a thickness of from about 1000 to about 5000 angstroms.

Finally, within the first preferred embodiment of the present invention with respect to the series of patterned photoresist layers 36a, 36b, 36c and 36d, the series of patterned photoresist layers 36a, 36b, 36c and 36d may be formed from any of several photoresist materials as are conventional in the art of microelectronics fabrication, including photoresist materials selected from the general groups of photoresist materials including but not limited to positive photoresist materials and negative photoresist materials. Preferably, each of the patterned photoresist layers 36a, 36b, 36c and 36d is formed upon the blanket hard mask layer 34 to a thickness of from about 3000 to about 12000 angstroms.

As is illustrated within the schematic cross-sectional diagram of FIG. 1, each of the patterned photoresist layers 36a, 36b and 36c is a comparatively narrow patterned photoresist layer which: (1) has a linewidth W1 typically and preferably from about 0.2 to about 1.0 microns; and (2) is separated from an adjoining patterned photoresist layer 36a, 36b or 36c within the series of comparatively narrow patterned photoresist layers 36a, 36b and 36c by a narrow pitch W2 typically and preferably from about 0.2 to about 1.0 microns. Similarly, as is also illustrated within the schematic cross-sectional diagram of FIG. 1, the group of comparatively narrow linewidth patterned photoresist layers 36a, 36b and 36c is separated from a comparatively wide patterned photoresist layer 36d of linewidth W4 typically and preferably greater than about 1.0 micron by a comparatively wide pitch W3 typically and preferably greater than about 1.0 micron.

Figure 2:
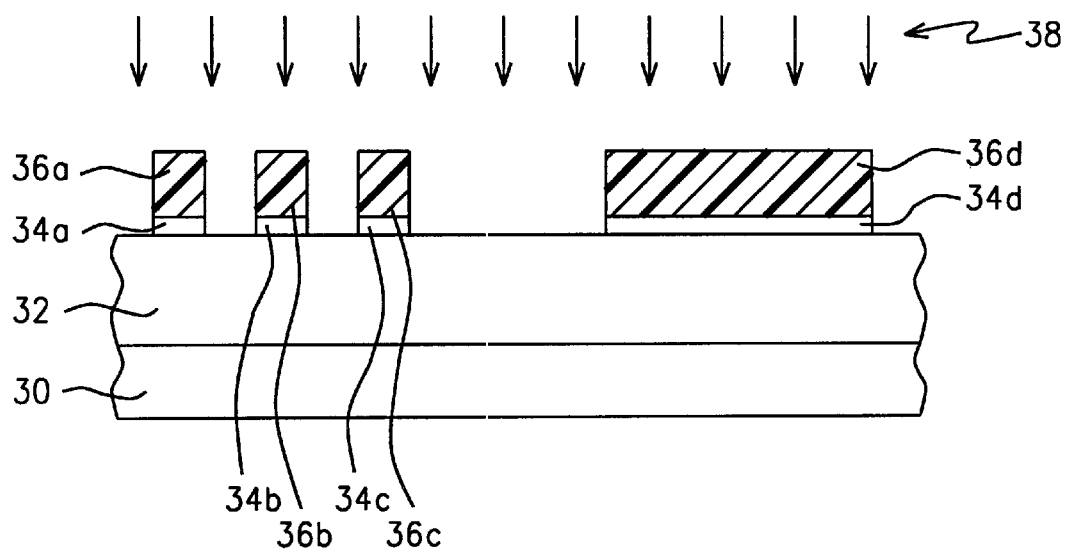

Referring now to FIG. 2, there is shown a schematic cross-sectional diagram illustrating the results of further processing of the microelectronics fabrication whose schematic cross-sectional diagram is illustrated within FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket hard mask layer 34 has been patterned to form the patterned hard mask layers 34a, 34b, 34c and 34d while employing the series of patterned photoresist layers 36a, 36b, 36c and 36d as a first etch mask layer, through etching with a first plasma 38. Within the first preferred embodiment of the present invention, the first plasma 38 employs a first etchant gas composition appropriate to a hard mask material from which is formed the blanket hard mask material 34.

Figure 3:
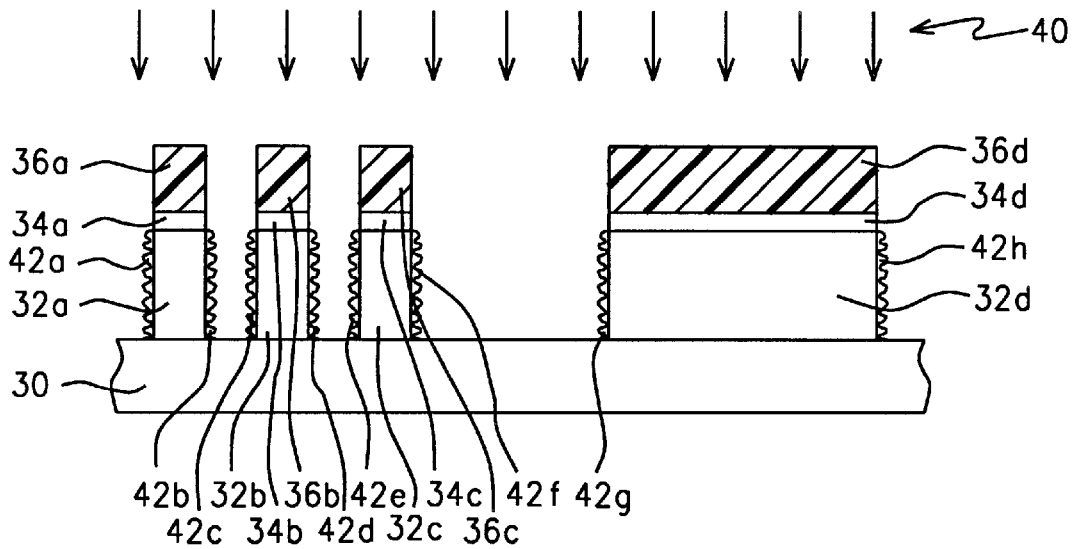

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the blanket chlorine containing plasma etchable layer 32 has been patterned to form a series of patterned chlorine containing plasma etchable layers 32a, 32b, 32c and 32d while employing at least the patterned hard mask layers 34a, 34b, 34c and 34d as a second etch mask layer, through etching with a second plasma 40. As is illustrated within the schematic cross-sectional diagram of FIG. 3, incident to forming the patterned chlorine containing plasma etchable layers 32a, 32b, 32c and 32d, there is formed upon the sidewalls of the patterned chlorine containing plasma etchable layers 32a, 32b, 32c and 32d a series of sidewall passivation residue layers 42a, 42b, 42c, 42d, 42e, 42f, 42g and 42h.

Within the first preferred embodiment of the present invention, the second plasma 40 employs a second etchant gas composition which upon plasma activation forms: (1) a chlorine containing etchant species which is employed in forming the series of patterned chlorine containing plasma etchable layers 32a, 32b, 32c and 32d from the blanket chlorine containing plasma etchable layer 32; along with (2) a sidewall passivation layer forming species which forms the series of sidewall passivation residue layers 42a, 42b, 42c, 42d, 42e, 42f, 42g and 42h upon the sidewalls of the patterned chlorine containing plasma etchable layers 32a, 32b, 32c and 32d. Within the method of the present invention, the chlorine containing etchant species is intended as independent of the sidewall passivation layer forming species. Preferably, the chlorine containing etchant species is derived from a chlorine containing gas selected from the group consisting of at least one of chlorine, hydrogen chloride and boron trichloride. Preferably the sidewall passivation layer forming species is derived from a gas selected from the group consisting of perfluorocarbons of up to four carbon atoms, hydrofluorocarbons of up to four carbon atoms, hydrogen halides and nitrogen. Similarly, patterned photoresist layer residues remaining incident to etching the blanket hard mask layer 34 to form the patterned hard mask layers 34a, 34b, 34c and 34d may also assist in forming a sidewall passivation layer. The second etchant gas composition may also incorporate diluents and carrier gases as are desirable to provide a stable second plasma 40. However, the second etchant gas composition preferably does not comprise an etchant gas which upon plasma activation forms an oxygen containing oxidizing species, since that presence within the second plasma 40 of an oxygen containing oxidizing species would typically compromise linewidth control of the patterned chlorine containing plasma etchable layers 32a, 32b, 32c and 32d and formation of the sidewall passivation residue layers 42a, 42b, 42c, 42d, 42e, 42f, 42g and 42h.

Figure 4:
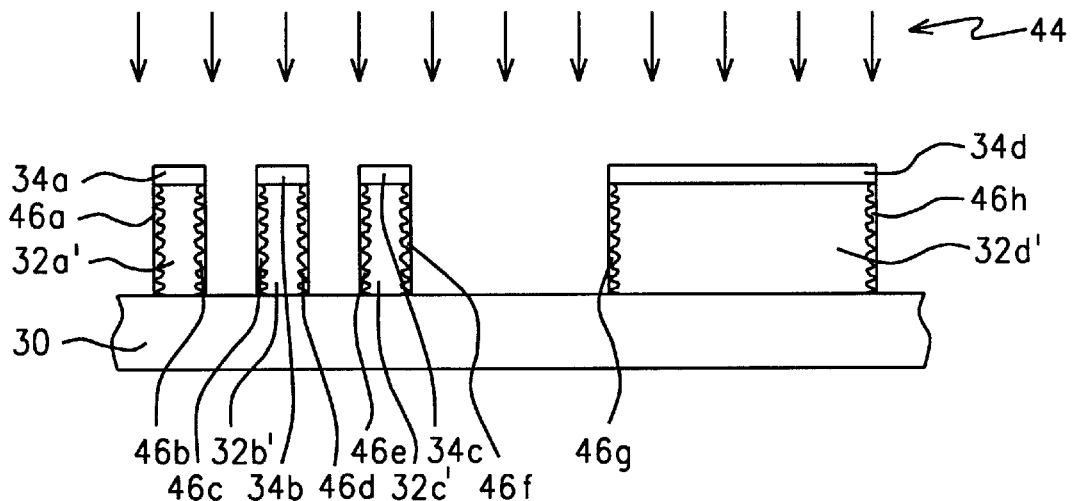

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein: (1) the patterned photoresist layers 36a, 36b, 36c and 36d have been stripped from the corresponding patterned hard mask layers 34a, 34b, 34c and 34d; (2) the sidewall passivation residue layers 42a, 42b, 42c, 42d, 42e, 42f, 42g and 42h have been stripped from the corresponding patterned chlorine containing plasma etchable layers 32a, 32b, 32c and 32d; and (3) the patterned chlorine containing plasma etchable layers 32a, 32b, 32c and 32d have been partially oxidized to form the partially oxidized patterned chlorine containing plasma etchable layers 32a', 32b', 32c' and 32d' having formed upon their sidewalls a series of oxidized chlorine containing plasma etchable material sidewall passivation layers 46a, 46b, 46c, 46d, 46e, 46f, 46g and 46h, through exposure to a third plasma 44.

Within the first preferred embodiment of the present invention, the third plasma 44 employs a third etchant gas composition which upon plasma activation forms an oxygen containing oxidizing species. The oxygen containing oxidizing species may be derived from an oxygen containing gas selected from the group consisting of oxygen and ozone. Similarly, the third plasma 44 may also incorporate suitable diluent gases to assure a stable third plasma 44.

As is understood by a person skilled in the art, although the schematic cross-sectional diagram of FIG. 4 illustrates the patterned photoresist layers 36a, 36b, 36c and 36d being stripped from the patterned hard mask layers 34a, 34b, 34c and 34d simultaneously with stripping the sidewall passivation residue layers 42a, 42b, 42c, 42d, 42e, 42f, 42g and 42h from the corresponding patterned chlorine containing plasma etchable layers 32a, 32b, 32c and 32d, it is also feasible and under certain circumstances desirable within the present invention that the patterned photoresist layers 36a, 36b, 36c and 36d be independently stripped from the corresponding patterned hard mask layers 34a, 34b, 34c and 34d. Under such circumstances, the patterned photoresist layers 36a, 36b, 36c and 36d may be stripped intervening the first plasma etch method and the second plasma etch method. Under such circumstances, the patterned photoresist layers may be stripped employing wet chemical stripping methods or dry plasma stripping methods as are known in the art of microelectronics fabrication.

Similarly, as is also understood by a person skilled in the art, it is desirable and feasible within the method of the present invention to select a thickness of the patterned photoresist layers 36a, 36b, 36c and 36d such that they will be completely stripped from the surfaces of the patterned hard mask layers 34a, 34b, 34c and 34d while not over oxidizing the patterned chlorine containing plasma etchable layers 32a, 32b, 32c and 32d when forming the partially oxidized patterned chlorine containing plasma etchable layers 32a', 32b', 32c'and 32d'.

Upon forming the microelectronics fabrication whose schematic cross-sectional diagram is illustrated in FIG. 4, there is formed a microelectronics fabrication having formed therein a series of patterned chlorine containing plasma etchable layers, where the series of patterned chlorine containing plasma etchable layers is formed: (1) while employing a series of patterned photoresist layers each of attenuated thickness; and (2) with uniform sidewall profile and with attenuated areal density related etching inhomogeneities such as microloading effects and aspect ratio dependent etching effects. The present invention realizes the foregoing objects by employing when forming the series of patterned chlorine containing plasma etchable layers: (1) a patterned hard mask layer in conjunction with; (2) a sequential pair of plasma etch methods; where: (a) a first plasma etch method employs an etchant gas composition which upon plasma activation forms a chlorine containing etchant species and a sidewall passivation layer forming species; and (b) a second plasma etch method employs a second etchant gas composition which upon plasma activation forms an oxygen containing oxidizing species.

Second Preferred Embodiment

Figure 5:
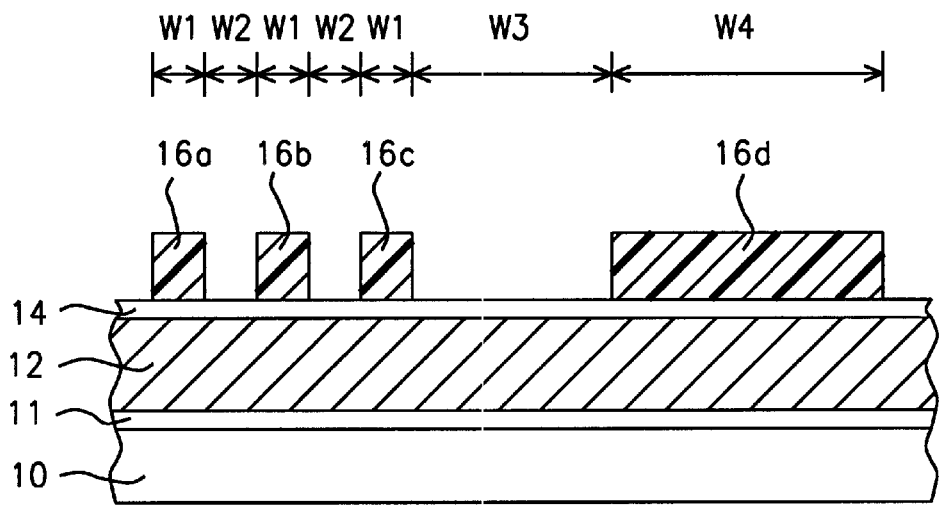
FIG. 5, FIG. 6, FIG. 7, FIG. 8 and FIG. 9 show a series of schematic cross-sectional diagrams illustrating the results of forming in accord with a more specific embodiment of the present invention which comprises a second preferred embodiment of the present invention a patterned aluminum containing conductor layer within a microelectronics fabrication.

Referring now to FIG. 5 to FIG. 9, there is shown a series of schematic cross-sectional diagram illustrating the results of progressive stages in forming within a microelectronics fabrication in accord with a more specific preferred embodiment of the present invention which comprises a second preferred embodiment of the present invention a patterned aluminum containing conductor layer. Shown in FIG. 5 is a schematic cross-sectional diagram of the microelectronics fabrication at an early stage in its fabrication.

Shown in FIG. 5 is a substrate 10 having formed thereupon or thereover a series of three blanket layers. The series of three blanket layers includes: (1) a blanket barrier layer 11 formed upon the substrate 10; (2) a blanket aluminum containing conductor layer 12 formed upon the blanket barrier layer 11; and (3) a blanket hard mask layer 14 formed upon the blanket aluminum containing conductor layer 12. Finally, there is shown within FIG. 5 a series of patterned photoresist layers 16a, 16b, 16c and 16d formed upon the blanket hard mask layer 14.

Within the second preferred embodiment of the present invention the substrate 10 is analogous or equivalent to the substrate 30 employed within the first preferred embodiment of the present invention as illustrated within the schematic cross-sectional diagram of FIG. 1.

Within the second preferred embodiment of the present invention with respect to the blanket barrier layer 11, the blanket barrier layer 11 may be formed from any of several barrier materials as are common in the art of microelectronics fabrication, such barrier materials including but not limited to titanium, titanium nitride, titanium tungsten alloy and tungsten nitride barrier materials. The blanket barrier layer 11 may be formed employing methods as are conventional in the art of microelectronics fabrication, including but not limited to thermally assisted evaporation methods, chemical vapor deposition (CVD) methods and physical vapor deposition (PVD) methods. Preferably, the blanket barrier layer 11 is formed of a bilayer titanium/titanium nitride barrier material formed upon the substrate 10. The bilayer titanium/titanium nitride barrier material employs a titanium layer of thickness up to about 1200 angstroms formed closer to the substrate 10 and a titanium nitride layer of thickness about 100 to about 2000 angstroms formed upon the titanium layer.

Within the second preferred embodiment of the present invention with respect to the blanket aluminum containing conductor layer 12, the blanket aluminum containing conductor layer 12 may be formed from any of several aluminum containing conductor materials as are conventional in the art of microelectronics fabrication, including but not limited to aluminum, aluminum copper alloy, and aluminum copper silicon alloy aluminum containing conductor materials. Similarly with the blanket barrier layer 11, the blanket aluminum containing conductor layer 12 may also be formed employing methods as are conventional in the art of microelectronics fabrication, such methods including but not limited to thermally assisted evaporation methods, chemical vapor deposition (CVD) methods and physical vapor deposition (PVD) sputtering methods. For the second preferred embodiment of the present invention, the blanket aluminum containing conductor layer 12 is preferably formed to a thickness of from about 1000 to about 11000 angstroms upon the blanket barrier layer 11.

Within the preferred embodiment of the present invention with respect to the blanket hard mask layer 14, the blanket hard mask layer 14 is, analogously with the blanket hard mask layer 34 within the first preferred embodiment of the present invention as illustrated within the schematic cross-sectional diagram of FIG. 1, formed of a hard mask material which exhibits limited susceptibility to etching within a plasma etch method employed for forming a series of patterned aluminum containing conductor layers from the blanket aluminum containing conductor layer 12. Such hard mask materials include, but are not limited to, metals with significantly different plasma etch characteristics in comparison within aluminum containing conductor materials, as well as several dielectric materials, including but not limited to silicon oxide dielectric materials, silicon nitride dielectric materials and silicon oxynitride dielectric materials.

For the second preferred embodiment of the present invention, the blanket hard mask layer 14 is formed upon the blanket aluminum containing conductor layer 12 preferably from a dielectric hard mask material, such as but not limited to as silicon oxide hard mask material, a silicon nitride hard mask material or a silicon oxynitride hard mask material. Preferably, the blanket hard mask layer 14 is formed upon the blanket aluminum containing conductor layer 12 to a thickness of from about 1000 to about 5000 angstroms.

Finally, within the preferred embodiment of the present invention with respect to the series of patterned photoresist layers 16a, 16b, 16c and 16d, the series of patterned photoresist layers 16a, 16b, 16c and 16d may be formed employing methods and materials analogous or equivalent to the methods and material employed for forming the series of patterned photoresist layers 36a, 36b, 36c and 36d within the first preferred embodiment of the present invention as illustrated within the schematic cross-sectional diagram of FIG. 1. As is also illustrated within the schematic cross-sectional diagram of FIG. 5, the patterned photoresist layers 16a, 16b, 16c and 16d have linewidth dimensions W1 and W4, as well as pitch dimensions W2 and W3, analogous or equivalent to the corresponding linewidth dimensions and pitch dimensions of the patterned photoresist layers 36a, 36b, 36c and 36d within the first preferred embodiment of the present invention as illustrated within the schematic cross-sectional diagram of FIG. 1.

Figure 6:
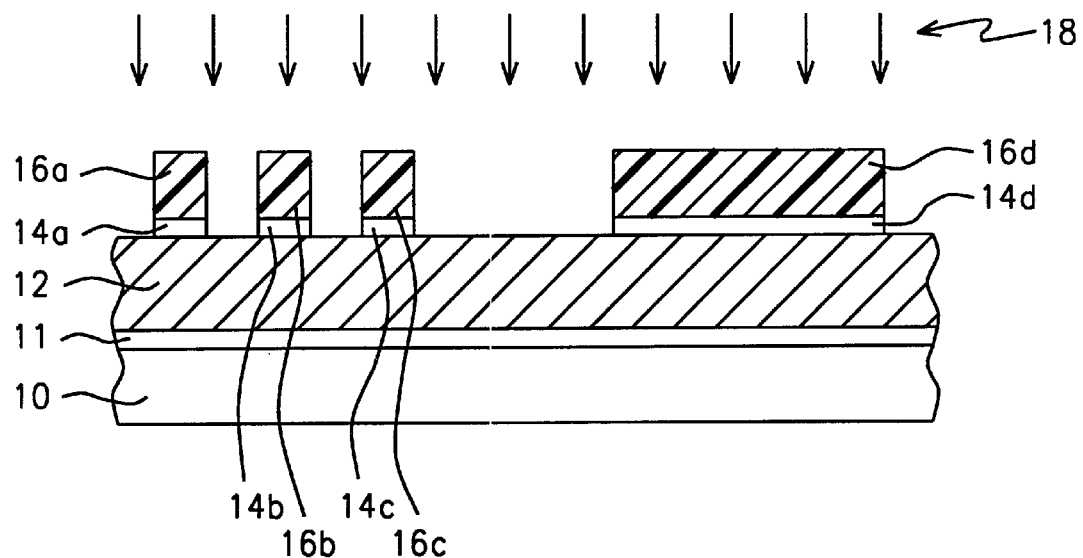

Referring now to FIG. 6, there is shown a schematic cross-sectional diagram illustrating the results of further processing of the microelectronics fabrication whose schematic cross-sectional diagram is illustrated within FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the blanket hard mask layer 14 has been patterned to form the patterned hard mask layers 14a, 14b, 14c and 14d while employing the series of patterned photoresist layers 16a, 16b, 16c and 16d as a first etch mask layer, through etching with a first plasma 18.

Within the second preferred embodiment of the present invention, when the blanket hard mask layer 14 is formed from a dielectric hard mask material such as but not limited to a silicon oxide hard mask material, a silicon nitride hard mask material or a silicon oxynitride hard mask material, the first plasma 18 preferably employs a first etchant gas composition which upon plasma activation forms a fluorine containing etchant species. Typically and preferably, the first etchant gas composition comprises a perfluorocarbon etchant gas and/or a hydrofluorocarbon etchant gas of up to four carbon atoms, along with an optional argon sputtering gas, as well as other diluent gases as may be desirable for stabilizing the first plasma 18. More preferably, the first etchant gas composition comprises carbon tetrafluoride, trifluoromethane, octafluorocyclobutane and argon, along with carbon monoxide, oxygen and nitrogen.

Preferably, the first plasma etch method also employs for processing an eight inch diameter substrate 10: (1) a reactor chamber pressure of from about 1 to about 1000 mtorr; (2) a radio frequency power of from about 100 to about 2000 watts at a radio frequency of 13.56 MHZ; (3) a substrate 10 temperature of from about 20 to about 60 degrees centigrade; and (4) a flow rate of about 5 to about 2000 standard cubic centimeters per minute (sccm) for each of the seven above listed gases within the first etchant gas composition.

Figure 7:
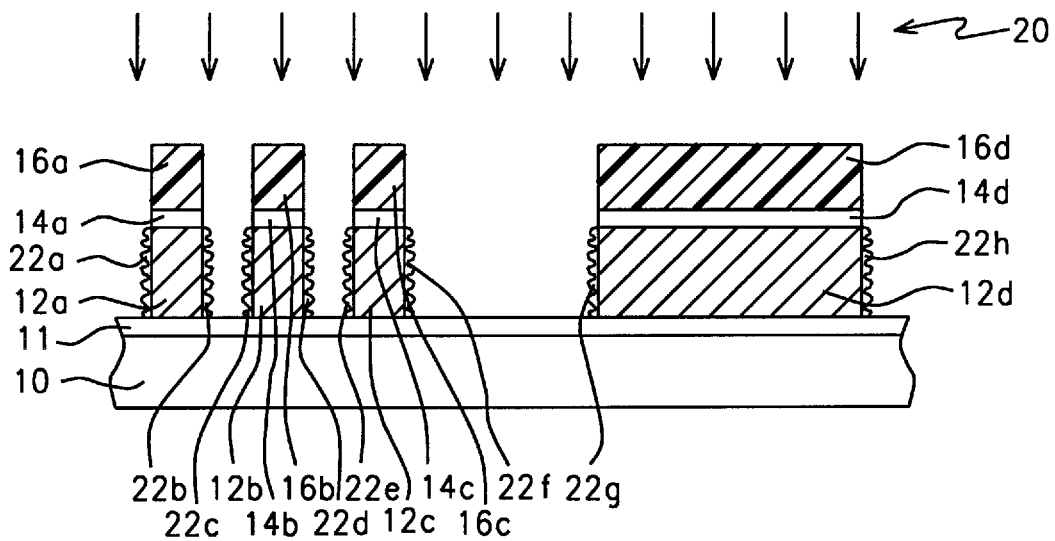

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein the blanket aluminum containing conductor layer 12 has been patterned to form a series of patterned aluminum containing conductor layers 12a, 12b, 12c and 12d while employing at least the patterned hard mask layers 14a, 14b, 14c and 14d as a second etch mask layer, through etching with a second plasma 20. As is illustrated within the schematic cross-sectional diagram of FIG. 7, incident to forming the series of patterned aluminum containing conductor layers 12a, 12b, 12c and 12d from the blanket aluminum containing conductor layer 12, there is formed upon the sidewalls of the patterned aluminum containing conductor layers 12a, 12b, 12c and 12d a series of sidewall passivation residue layers 22a, 22b, 22c, 22d, 22e, 22f, 22g and 22h.

Analogously with the first preferred embodiment of the present invention, within the second preferred embodiment of the present invention the second plasma 20 employs a second etchant gas composition which upon plasma activation forms: (1) a chlorine containing etchant species which is employed in forming the series of patterned aluminum containing conductor layers 12a, 12b, 12c and 12d from the blanket aluminum containing conductor layer 12; along with (2) a sidewall passivation layer forming species which forms the sidewall passivation residue layers 22a, 22b, 22c, 22d, 22e, 22f, 22g and 22h. Preferably, the chlorine containing etchant species is derived from at least one of chlorine, hydrogen chloride and boron trichloride. Preferably, the sidewall passivation layer forming species is derived from at least one of carbon tetrafluoride, a hydrofluorocarbon having one carbon atom, a hydrogen halide (such as hydrogen bromide or hydrogen chloride) and nitrogen. More preferably, second etchant gas composition comprises chlorine, boron trichloride and either trifluoromethane or nitrogen. Similarly with the first preferred embodiment of the present invention, the second etchant gas composition does not comprise an oxygen containing oxidizing species.

Preferably, the second plasma etch method also employs for processing an eight inch diameter substrate 10: (1) a reactor chamber pressure of from about 1 to about 20 mtorr; (2) a radio frequency power of from about 50 to about 2000 watts at a radio frequency of 13.56 MHZ; (3) a substrate 10 temperature of from about 30 to about 60 degrees centigrade; (4) a chlorine flow rate of about 50 to about 100 standard cubic centimeters per minute (sccm); (5) a boron trichloride flow rate of from about 20 to about 80 standard cubic centimeters per minute (sccm); and (6) either: (a) a trifluoromethane flow rate of about 1 to about 10 standard cubic centimeters per minute (sccm); or (b) a nitrogen flow rate of from about 1 to about 10 standard cubic centimeters per minute (sccm).

Figure 8:
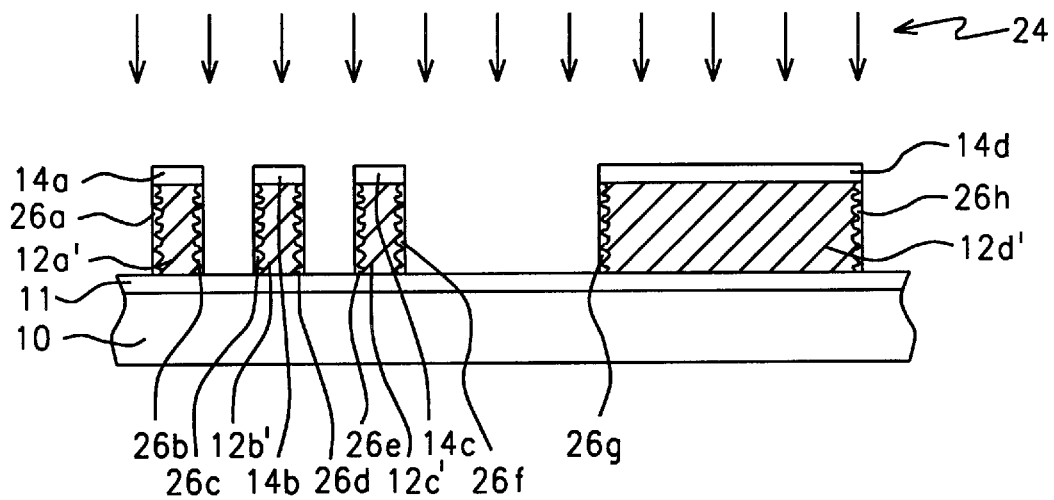

Referring now to FIG. 8, there is shown a schematic cross-sectional diagram illustrating the results of further processing of the microelectronics fabrication whose schematic cross-sectional diagram is illustrated in FIG. 7. Shown in FIG. 8 is a schematic cross-sectional diagram of a microelectronics fabrication otherwise equivalent to the microelectronics fabrication whose schematic cross-sectional diagram is illustrated in FIG. 7, but wherein: (1) the patterned photoresist layers 16a, 16b, 16c and 16d have been stripped from the corresponding patterned hard mask layers 14a, 14b, 14c and 14d; (2) the sidewall passivation residue layers 22a, 22b, 22c, 22d, 22e, 22g, 22g and 22h have been stripped from the corresponding patterned aluminum containing conductor layers 12a, 12b, 12c and 12d; and (3) the patterned aluminum containing conductor layers 12a, 12b, 12c and 12d have been oxidized to form the partially oxidized patterned aluminum containing conductor layers 12a', 12b', 12c' and 12d' having formed upon their sidewalls a series of oxidized aluminum containing conductor layer sidewall passivation layers 26a, 26b, 26c, 26d, 26e, 26f, 26g and 26h, incident to processing within a third plasma 24.

Within the second preferred embodiment of the present invention, the third plasma 24 is formed employing methods and materials analogous or equivalent to the methods and materials employed in forming the third plasma 44 within the first preferred embodiment of the present invention as illustrated within the schematic cross-sectional diagram of FIG. 4. More preferably, within the second preferred embodiment of the present invention, the third plasma 24 employs a third etchant gas composition comprising oxygen.

Preferably, the third plasma etch method also employs when processing an eight inch diameter substrate 10: (1) a reactor chamber pressure of from about 500 to about 10000 mtorr; (2) a radio frequency power of from about 100 to about 2000 watts at a radio frequency of 13.56 MHZ; (3) a substrate 10 temperature of from about 200 to about 280 degrees centigrade; and (4) an oxygen flow rate of about 500 to about 4000 standard cubic centimeters per minute (sccm). Similarly, there may also be employed within the third plasma etch method each of water vapor and nitrogen at a flow rate of up to about 1000 standard cubic centimeters per minute (sccm) each.

Figure 9:
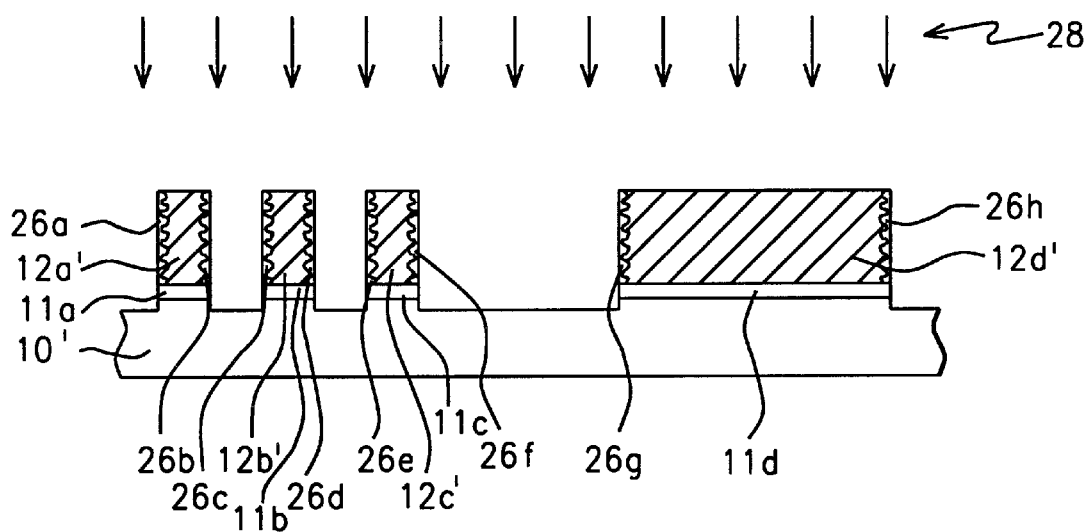

Referring now to FIG. 9, there is shown a schematic cross-sectional diagram illustrating the results of further processing of the microelectronics fabrication whose schematic cross-sectional diagram is illustrated in FIG. 8. Shown in FIG. 9 is a schematic cross-sectional diagram of a microelectronics fabrication otherwise equivalent to the microelectronics fabrication whose schematic cross-sectional diagram is illustrated in FIG. 8, but wherein: (1) the blanket barrier layer 11 has been patterned to form the patterned barrier layers 11a, 11b, 11c and 11d while overetching into the substrate 10 to form a partially etched substrate 10'; and (2) the patterned hard mask layers 14a, 14b, 14c and 14d have been stripped from the patterned aluminum containing conductor layers 12a, 12b, 12c and 12d, through etching within a fourth plasma 28 while employing at least the partially oxidized patterned aluminum containing conductor layers 12a', 12b', 12c' and 12d' and the oxidized aluminum containing conductor layer sidewall passivation layers 26a, 26b, 26c, 26d, 26e, 26f, 26g and 26h as a fourth etch mask layer.

Within the second preferred embodiment of the present invention, the microelectronics fabrication whose schematic cross-sectional diagram is illustrated within FIG. 9 may be formed from the microelectronics fabrication whose schematic cross-sectional diagram is illustrated in FIG. 8 while employing the fourth plasma 28 which employs materials and parameters analogous or equivalent to the materials and parameters employed within the second plasma 20 as illustrated within the schematic cross-sectional diagram of FIG. 7, possible with absence of the sidewall passivation layer forming species.

Upon forming the microelectronics fabrication whose schematic cross-sectional diagram is illustrated in FIG. 9, there is formed a microelectronics fabrication having formed therein a series of patterned aluminum containing conductor layers, where the series of patterned aluminum containing conductor layers is formed: (1) while employing a series of patterned photoresist layers of attenuated thickness when forming the series of patterned aluminum containing conductor layers; and (2) with uniform sidewall profile and with attenuated density related etching inhomogeneities such as microloading effects and aspect ratio dependent etching effects. The present invention realizes the foregoing objects by employing when forming the series of patterned aluminum containing conductor layers: (1) a hardmask layer in conjunction with; (2) a pair of plasma etch methods, where: (a) the first plasma etch method employs an etchant gas composition which upon plasma activation forms an active chlorine containing etching species and a sidewall passivation layer forming species to form the patterned aluminum containing conductor layers from a blanket aluminum containing conductor layer while also forming a series of sidewall passivation residue layers upon the patterned aluminum containing conductor layers; and (b) the second plasma etch method employs an etchant gas composition which upon plasma activation forms an oxygen containing oxidizing species which sequentially strips from the sidewalls of the patterned aluminum containing conductor layers the sidewall passivation residue layers while forming a series of partially oxidized aluminum containing conductor layers having formed thereupon a series of oxidized aluminum containing conductor layer sidewall passivation layers.

As is understood by a person skilled in the art, the preferred embodiments of the present invention are illustrative of the present invention rather than limiting of the present invention. Revisions and modifications may be made to methods, materials, structures and dimensions through which may be formed a microelectronics fabrication in accord with the preferred embodiments of the present invention which still forming a microelectronics fabrication in accord with the present invention, as defined by the accompanying claims.

What is claimed is:

1. A method for forming a patterned layer within a microelectronics fabrication comprising:
    providing a substrate;
    forming over the substrate a blanket chlorine containing plasma etchable layer;
    forming upon the blanket chlorine containing plasma etchable layer a blanket hard mask layer;
    forming upon the blanket hard mask layer a patterned photoresist layer;
    etching the blanket hard mask layer to form a patterned hard mask layer while employing a first plasma etch method in conjunction with the patterned photoresist layer as a first etch mask layer, the first plasma etch method employing a first etchant gas composition appropriate to a hard mask material from which is formed the blanket hard mask layer;
    etching the blanket chlorine containing plasma etchable layer to form a patterned chlorine containing plasma etchable layer while employing a second plasma etch method in conjunction with at least the patterned hard mask layer as a second etch mask layer, the second plasma etch method employing a second etchant gas composition which upon plasma activation forms a chlorine containing etchant species and a sidewall passivation layer forming species, the patterned chlorine containing plasma etchable layer having incident to the second plasma etch method a sidewall passivation layer formed upon a sidewall of the patterned chlorine containing plasma etchable layer; and
    stripping from the sidewall of the patterned chlorine containing plasma etchable layer the sidewall passivation layer while sequentially oxidizing the sidewall of the patterned chlorine containing plasma etchable layer to form an oxidized chlorine containing plasma etchable material sidewall layer upon a partially oxidized patterned chlorine containing plasma etchable layer while employing a third plasma etch method, the third plasma etch method employing a third etchant gas composition which upon plasma activation forms an oxygen containing oxidizing species.

2. The method of claim 1 wherein the substrate is employed within a microelectronics fabrication selected from the group consisting of a semiconductor integrated circuit microelectronics fabrication, a solar cell microelectronics fabrication, a ceramic substrate microelectronics fabrication and a flat panel display microelectronics fabrication.

3. The method of claim 1 wherein the blanket chlorine containing plasma etchable layer is formed from a chlorine containing plasma etchable material selected from the group consisting of aluminum containing conductor materials and silicon materials.

4. The method of claim 1 wherein:
    the chlorine containing etchant species is derived from a gas selected from at least one of the group of chlorine, hydrogen chloride and boron trichloride; and
    the sidewall passivation layer forming species is derived from a gas selected from the group consisting of perfluorocarbons of up to four carbon atoms, hydrofluorocarbons of up to four carbon atoms, hydrogen halides and nitrogen.

5. The method of claim 1 wherein the second plasma etch method does not employ an etchant gas composition which upon plasma activation forms an oxygen containing oxidizing species.

6. The method of claim 1 wherein the third etchant gas composition comprises an oxygen containing etchant gas selected from the group consisting of oxygen and ozone.

7. The method of claim 1 wherein:
    the sidewall passivation layer is stripped from the sidewall of the patterned chlorine containing plasma etchable layer simultaneously with stripping the patterned photoresist layer from the patterned hard mask layer; and
    a thickness of the patterned photoresist layer is selected such that the patterned photoresist layer is completely stripped from the patterned hard mask layer before the patterned chlorine containing plasma etchable layer is oxidized to form the partially oxidized patterned chlorine containing plasma etchable layer.

8. A method for forming a patterned aluminum containing conductor layer within a microelectronics fabrication comprising:
    providing a substrate;
    forming over the substrate a blanket aluminum containing conductor layer;

forming upon the blanket aluminum containing conductor layer a blanket hard mask layer;

forming upon the blanket hard mask layer a patterned photoresist layer;

etching the blanket hard mask layer to form a patterned hard mask layer while employing a first plasma etch method in conjunction with the patterned photoresist layer as a first etch mask layer, the first plasma etch method employing a first etchant gas composition appropriate to a hard mask material from which is formed the blanket hard mask layer;

etching the blanket aluminum containing conductor layer to form a patterned aluminum containing conductor layer while employing a second plasma etch method in conjunction with at least the patterned hard mask layer as a second etch mask layer, the second plasma etch method employing a second etchant gas composition which upon plasma activation forms a chlorine containing etchant species and a sidewall passivation layer forming species, the patterned aluminum containing conductor layer having incident to the second plasma etch method a sidewall passivation layer formed upon a sidewall of the patterned aluminum containing conductor layer; and stripping from the sidewall of the patterned aluminum containing conductor layer the sidewall passivation layer while sequentially oxidizing the sidewall of the patterned aluminum containing conductor layer to form an oxidized aluminum containing conductor material sidewall layer upon a partially oxidized patterned aluminum containing conductor layer while employing a third plasma etch method, the third plasma etch method employing a third etchant gas composition which upon plasma activation forms an oxygen containing oxidizing species.

9. The method of claim 8 wherein the substrate is employed within a microelectronics fabrication selected from the group consisting of a semiconductor integrated circuit microelectronics fabrication, a solar cell microelectronics fabrication, a ceramic substrate microelectronics fabrication and a flat panel display microelectronics fabrication.

10. The method of claim 8 wherein:
the chlorine containing etchant species is derived from a gas selected from at least one of the group of chlorine, hydrogen chloride and boron trichloride; and
the sidewall passivation layer forming species is derived from a gas selected from the group consisting of perfluorocarbons of up to four carbon atoms, hydrofluorocarbons of up to four carbon atoms, hydrogen halides and nitrogen.

11. The method of claim 8 wherein the second plasma etch method does not employ an etchant gas composition which upon plasma activation forms an oxygen containing oxidizing species.

12. The method of claim 8 wherein the third etchant gas composition comprises an oxygen containing etchant gas selected from the group consisting of oxygen and ozone.

13. The method of claim 8 wherein:
the sidewall passivation layer is stripped from the sidewall of the patterned aluminum containing conductor layer simultaneously with stripping the patterned photoresist layer from the patterned hard mask layer; and
a thickness of the patterned photoresist layer is selected such that the patterned photoresist layer is completely stripped from the patterned hard mask layer before the patterned aluminum containing conductor layer is oxidized to form the partially oxidized patterned aluminum containing conductor layer.

* * * * *